US011557329B2

(12) United States Patent
Tang et al.

(10) Patent No.: US 11,557,329 B2
(45) Date of Patent: Jan. 17, 2023

(54) MEMORY DEVICE

(71) Applicant: Yangtze Memory Technologies Co., Ltd., Wuhan (CN)

(72) Inventors: Qiang Tang, Wuhan (CN); Chunyuan Hou, Wuhan (CN)

(73) Assignee: Yangtze Memory Technologies Co., Ltd., Wuhan (CN)

( * ) Notice: Subject to any disclaimer, the term of this patent is extended or adjusted under 35 U.S.C. 154(b) by 207 days.

(21) Appl. No.: 16/889,767

(22) Filed: Jun. 1, 2020

(65) Prior Publication Data

US 2021/0327482 A1 Oct. 21, 2021

Related U.S. Application Data

(63) Continuation of application No. PCT/CN2020/085356, filed on Apr. 17, 2020.

(51) Int. Cl.
*G11C 8/08* (2006.01)
*H01L 27/24* (2006.01)

(52) U.S. Cl.
CPC ............ *G11C 8/08* (2013.01); *H01L 27/2454* (2013.01)

(58) Field of Classification Search
CPC . G11C 8/08; H01L 27/2454; H01L 27/10897; H01L 27/11526; H01L 27/11573; H01L 27/11575; H01L 27/11548; H01L 27/11524; H01L 27/11551; H01L 27/1157; H01L 27/11578; H01L 29/7827; H01L 21/823475; H01L 25/0657; H01L 27/1152; H01L 27/11568

USPC ........................................... 257/288; 365/158
See application file for complete search history.

(56) References Cited

U.S. PATENT DOCUMENTS

| | | | |
|---|---|---|---|
| 7,867,822 B2 | 1/2011 | Lee | |
| 9,595,535 B1 | 3/2017 | Ogawa | |
| 10,141,326 B1 | 11/2018 | Oh | |
| 10,510,738 B2 | 12/2019 | Kim | |
| 10,541,273 B2 | 1/2020 | Takaki | |
| 2016/0148943 A1 | 5/2016 | Hasegawa | |
| 2016/0240254 A1 | 8/2016 | Chen | |
| 2018/0358096 A1 | 12/2018 | Sakui | |
| 2019/0043836 A1 | 2/2019 | Fastow | |
| 2020/0066741 A1* | 2/2020 | Wu | H01L 27/11565 |
| 2020/0098748 A1 | 3/2020 | Xiao | |
| 2020/0176032 A1* | 6/2020 | Chiang | H01L 45/143 |
| 2020/0185397 A1* | 6/2020 | Chibvongodze | H01L 27/11548 |
| 2020/0303389 A1* | 9/2020 | Nakatsuka | H01L 23/528 |

(Continued)

FOREIGN PATENT DOCUMENTS

| | | |
|---|---|---|
| CN | 108022928 A | 5/2018 |
| CN | 110896669 A | 3/2020 |

(Continued)

*Primary Examiner* — Michael T Tran
(74) *Attorney, Agent, or Firm* — Winston Hsu

(57) ABSTRACT

A memory device includes a first substrate, a first memory array, a second substrate, and at least one first vertical transistor. The first memory array is disposed on the first substrate. The first memory array includes at least one first word line structure. The first memory array is disposed between the first substrate and the second substrate in a vertical direction. The first vertical transistor is electrically connected with the first word line structure. At least a part of the at least one first vertical transistor is disposed in the second substrate.

18 Claims, 10 Drawing Sheets

(56) References Cited

U.S. PATENT DOCUMENTS

| | | | |
|---|---|---|---|
| 2020/0357821 A1* | 11/2020 | Chen | H01L 27/11597 |
| 2020/0411072 A1* | 12/2020 | Zhang | H01L 27/11597 |
| 2021/0035999 A1* | 2/2021 | Nishikawa | H01L 27/11556 |
| 2021/0134779 A1 | 5/2021 | Huang | |
| 2022/0108985 A1* | 4/2022 | Nagatsuka | H01L 27/1207 |
| 2022/0208258 A1* | 6/2022 | Zhu | G11C 11/417 |

FOREIGN PATENT DOCUMENTS

| | | |
|---|---|---|
| CN | 110998846 A | 4/2020 |
| JP | 2015-56642 A | 3/2015 |
| TW | 1530953 B | 4/2016 |
| TW | 202002179 A | 1/2020 |
| WO | 2020/034152 A1 | 2/2020 |

\* cited by examiner

MEMORY DEVICE

CROSS REFERENCE TO RELATED APPLICATIONS

This application is a continuation of International Application No. PCT/CN2020/085356 filed on Apr. 17, 2020, which is incorporated herein by reference in its entirety.

BACKGROUND OF THE INVENTION

1. Field of the Invention

The present disclosure relates to a memory device, and more particularly, to a memory device including a vertical transistor.

2. Description of the Prior Art

Planar memory cells are scaled to smaller sizes by improving process technology, circuit design, programming algorithm, and fabrication process. However, as feature sizes of the memory cells approach a lower limit, planar process and fabrication techniques become challenging and costly. As a result, memory density for planar memory cells approaches an upper limit.

A three-dimensional (3D) memory architecture can address the density limitation in planar memory cells. The 3D memory architecture includes a memory array and peripheral devices for controlling signals to and from the memory array. As the dimension of the memory device becomes smaller and the memory cell density becomes higher, the interconnection structure between the memory array and the peripheral devices becomes more complicated and influences the related circuit design and/or the related manufacturing processes.

SUMMARY OF THE INVENTION

A memory device is provided in the present disclosure. In the memory device, a vertical transistor disposed in a substrate is electrically connected to a word line structure of a memory array disposed on another substrate. An area occupied by the vertical transistor on the substrate may be reduced, and a connection structure between the vertical transistor and the word line structure may be simplified accordingly.

According to an embodiment of the present disclosure, a memory device is provided. The memory device includes a first substrate, a first memory array, a second substrate, and at least one first vertical transistor. The first memory array is disposed on the first substrate. The first memory array includes at least one first word line structure. The first memory array is disposed between the first substrate and the second substrate in a vertical direction. The first vertical transistor is electrically connected with the first word line structure. At least a part of the at least one first vertical transistor is disposed in the second substrate.

In some embodiments, the at least one first vertical transistor includes a first semiconductor channel penetrating the second substrate in the vertical direction.

In some embodiments, the at least one first vertical transistor further includes a first gate electrode disposed in the second substrate and surrounding the first semiconductor channel in a horizontal direction.

In some embodiments, the at least one first vertical transistor further includes a first gate dielectric layer disposed in the second substrate and disposed between the first gate electrode and the first semiconductor channel.

In some embodiments, the first memory array includes a plurality of the at least one first word line structures, and the memory device comprises a plurality of the at least one first vertical transistors electrically connected with the plurality of the at least one first word line structures respectively.

In some embodiments, the first gate electrodes of the plurality of the at least one first vertical transistors are physically and electrically connected with one another in the second substrate.

In some embodiments, the second substrate includes a semiconductor region, and the first gate electrode includes a doped region disposed in the second substrate.

In some embodiments, the memory device further includes an isolation structure disposed in the second substrate, and the isolation structure is disposed between the semiconductor region and the first gate electrode.

In some embodiments, the memory device further includes a word line contact structure disposed between the at least one first vertical transistor and the at least one first word line structure, and the at least one first word line structure is electrically connected with the at least one first vertical transistor via the word line contact structure.

In some embodiments, the at least one first vertical transistor completely covers the word line contact structure in the vertical direction.

In some embodiments, the second substrate has a first side and a second side opposite to the first side in the vertical direction, and the first memory array and the word line contact structure are disposed at the first side of the second substrate.

In some embodiments, the memory device further includes a conductive line and a connection structure. The conductive line is disposed at the second side of the second substrate, and the connection structure is disposed at the second side of the second substrate and disposed between the conductive line and the at least one first vertical transistor. The conductive line is electrically connected with the at least one first word line structure via the connection structure, the at least one first vertical transistor, and the word line contact structure.

In some embodiments, the memory device further includes a third substrate, a second memory array, and at least one second vertical transistor. The first memory array is disposed between the first substrate and the third substrate in the vertical direction. The second memory array includes at least one second word line structure. The at least one second vertical transistor is electrically connected with the at least one second word line structure.

In some embodiments, the second memory array is disposed on the third substrate, and at least a part of the at least one second vertical transistor is disposed in the second substrate.

In some embodiments, the at least one second vertical transistor includes a second semiconductor channel and a second gate electrode. The second semiconductor channel penetrates the second substrate in the vertical direction. The second gate electrode is disposed in the second substrate and surrounds the second semiconductor channel in a horizontal direction.

In some embodiments, the at least one first vertical transistor includes a first gate electrode disposed in the second substrate, and the first gate electrode is physically and electrically connected with the second gate electrode.

In some embodiments, the at least one first vertical transistor includes a first gate electrode disposed in the second substrate, and the first gate electrode is electrically separated from the second gate electrode.

In some embodiments, the third substrate is disposed between the first substrate and the second substrate in the vertical direction, and the second memory array is disposed between the second substrate and the third substrate in the vertical direction.

In some embodiments, the second substrate is disposed between the first substrate and the third substrate in the vertical direction, and the second memory array is disposed between the second substrate and the third substrate in the vertical direction.

In some embodiments, the second memory array is disposed on the second substrate, and at least a part of the at least one second vertical transistor is disposed in the third substrate.

Other aspects of the present disclosure can be understood by those skilled in the art in light of the description, the claims, and the drawings of the present disclosure.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings, which are incorporated herein and form a part of the specification, illustrate embodiments of the present disclosure and, together with the description, further serve to explain the principles of the present disclosure and to enable a person skilled in the pertinent art to make and use the present disclosure.

DETAILED DESCRIPTION

Figure 1:
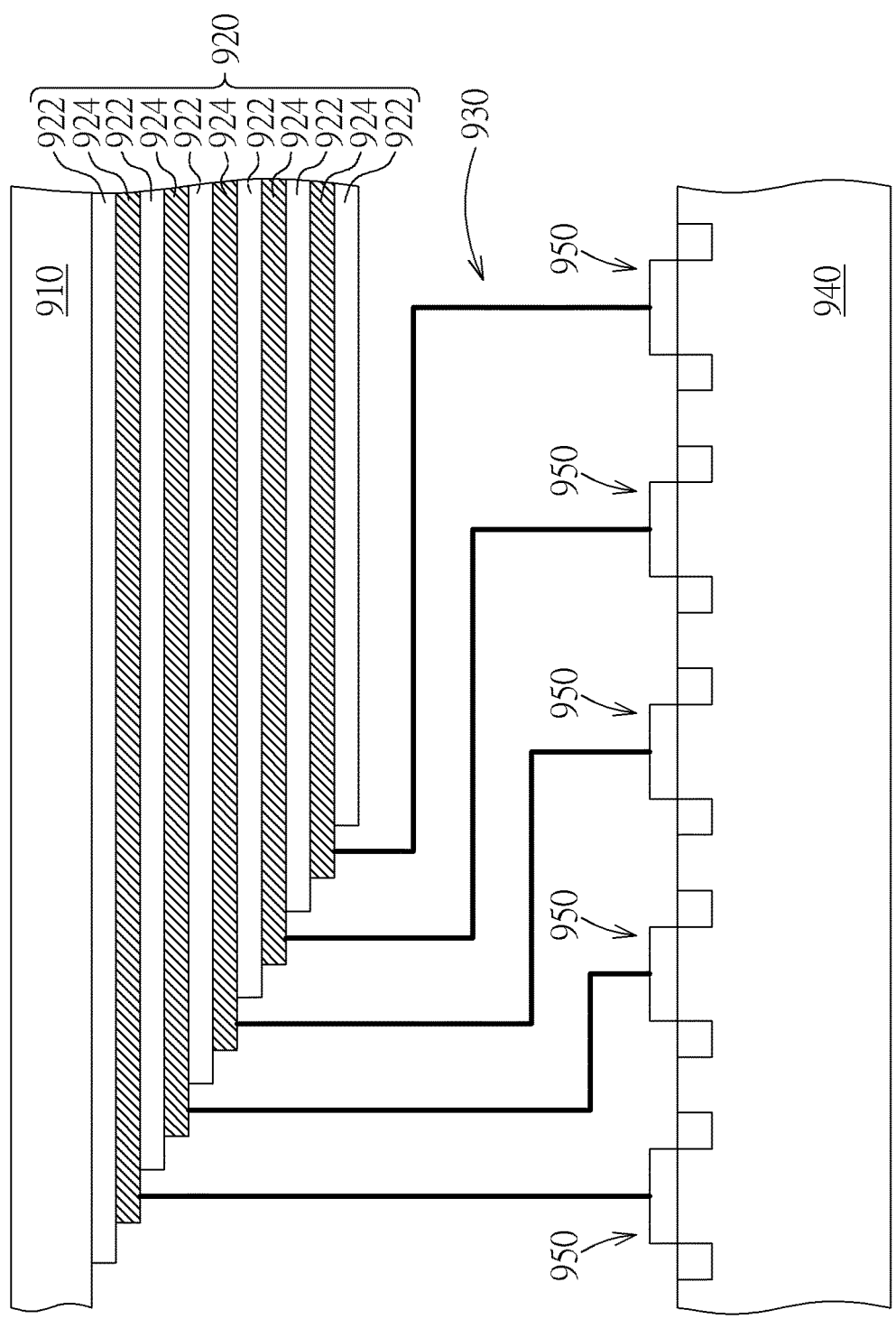
FIG. 1 is a schematic drawing illustrating a memory device according to an embodiment of the present disclosure.

Although specific configurations and arrangements are discussed, it should be understood that this is done for illustrative purposes only. A person skilled in the pertinent art will recognize that other configurations and arrangements can be used without departing from the spirit and scope of the present disclosure. It will be apparent to a person skilled in the pertinent art that the present disclosure can also be employed in a variety of other applications.

It is noted that references in the specification to "one embodiment," "an embodiment," "some embodiments," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of a person skilled in the pertinent art to effect such feature, structure or characteristic in connection with other embodiments whether or not explicitly described.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer and/or section from another. Thus, a first element, component, region, layer or section discussed below could be termed a second element, component, region, layer or section without departing from the teachings of the disclosure.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The term "forming" or the term "disposing" are used hereinafter to describe the behavior of applying a layer of material to an object. Such terms are intended to describe any possible layer forming techniques including, but not limited to, thermal growth, sputtering, evaporation, chemical vapor deposition, epitaxial growth, electroplating, and the like.

Please refer to FIG. 1. FIG. 1 is a schematic drawing illustrating a memory device according to an embodiment of the present disclosure. As shown in FIG. 1, in the memory device, an NAND memory array 920 may be disposed on a substrate 910, and planar transistors 950 configured to be electrically connected with the NAND memory array 920 may be disposed on another substrate 940. The NAND memory array 920 may include an alternating conductive/dielectric stack composed of dielectric layers 922 and conductive layers 924 alternately stacked in a vertical direction (such as a first direction D1 shown in FIG. 1), and each of the conductive layers 924 may be regarded as a word line in the NAND memory array 920. The alternating conductive/dielectric stack may have a staircase portion exposing a part of each word line, and each of the word lines may be electrically connected to a corresponding driving unit accordingly. For example, each of the planar transistors 950 may be electrically connected to one of the word lines via an interconnection structure 930 for controlling signals transmitting to the word lines, and the planar transistors 950 may be regarded as the driving units described above, but not limited thereto. However, each of the planar transistors 950 occupies a specific area on the substrate 940, most of the planar transistors 950 cannot be located corresponding to the exposed parts of the word lines exactly in the first direction D1, and the interconnection structure 930 has to become complicated accordingly. Additionally, the tiers of the word lines will be limited to a specific range because of the total area occupied by the planar transistors 950 on the substrate 940, and the storage capacity of the memory device is limited accordingly.

Figure 2:
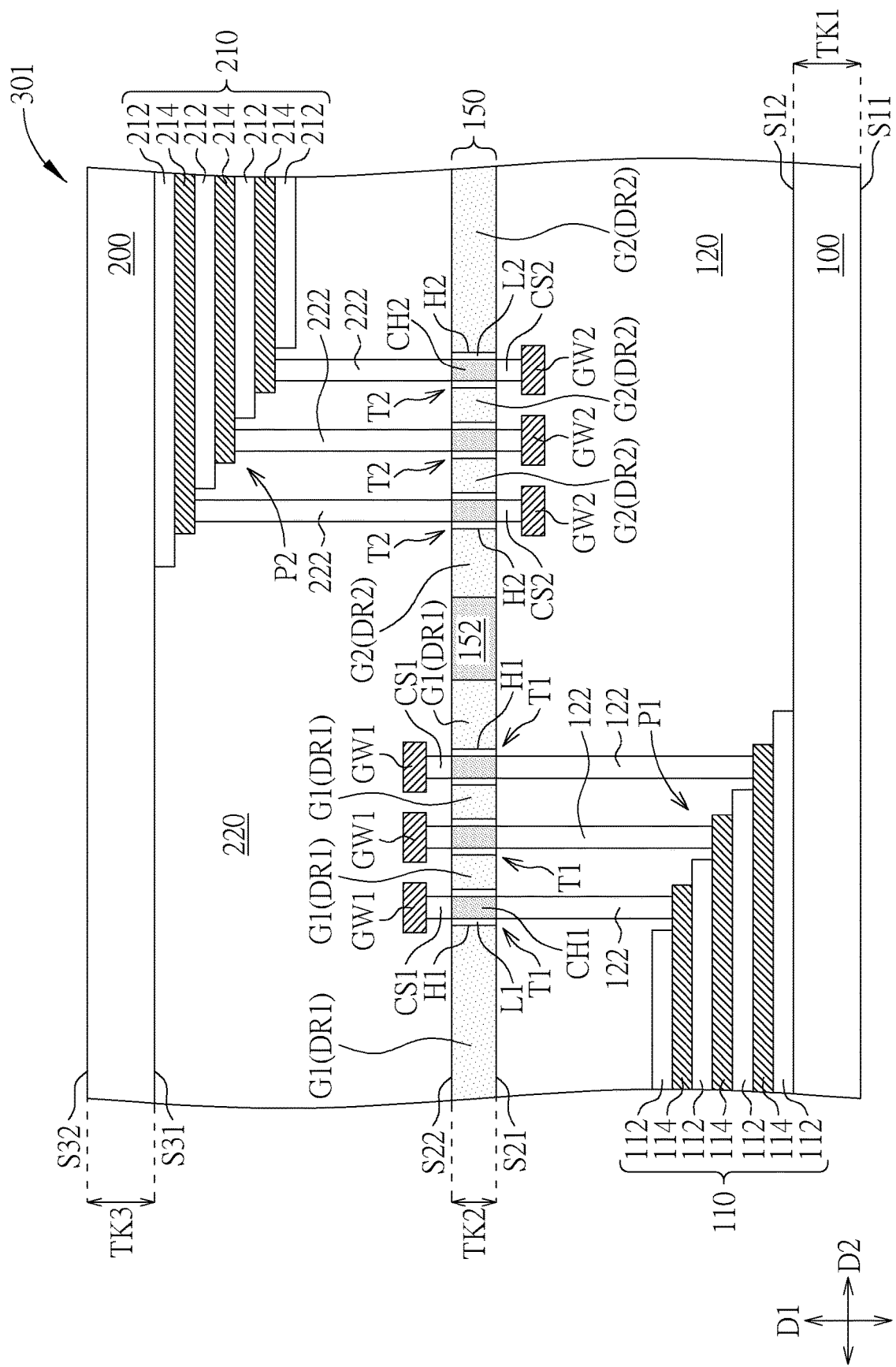
FIG. 2 is a schematic drawing illustrating a memory device according to a first embodiment of the present disclosure.

Please refer to FIG. 2. FIG. 2 is a schematic drawing illustrating a memory device 301 according to a first embodiment of the present disclosure. As shown in FIG. 2, the memory device 301 includes a first substrate 100, a first memory array 110, a second substrate 150, and at least one first vertical transistor T1. The first memory array 110 is disposed on the first substrate 100. The first memory array 110 includes at least one first word line structure 114. The first memory array 110 is disposed between the first substrate 100 and the second substrate 150 in a vertical direction (such as a first direction D1 shown in FIG. 2). The first vertical transistor T1 is electrically connected with the first word line structure 114. At least a part of the first vertical transistor T1 is disposed in the second substrate 150. The area occupied by the first vertical transistor T1 on the second substrate 150 may be relatively smaller than the area occupied by the planar transistor described above, and that will be beneficial to solve the related problems described above.

In some embodiments, the first memory array 110 may include a plurality of the first word line structures 114, and the memory device 301 may include a plurality of the first vertical transistors T1 correspondingly, but not limited thereto. The first vertical transistors T1 may be electrically connected with the first word line structures 114 respectively. In other words, each of the first word line structures 114 may be electrically connected with one of the first vertical transistors T1 in the second substrate 150. In some embodiments, the first memory array 110 may include an alternating conductive/dielectric stack composed of first dielectric layers 112 and the first word line structures 114 alternately stacked in the first direction D1, and the first memory array 110 may have a first staircase portion P1 at an end of the first memory array 110 in a horizontal direction (such as a second direction D2 shown in FIG. 2) for exposing a part of each of the first word line structures 114, but not limited thereto. The first direction D1 may be regarded as a thickness direction of the first substrate 100 and/or the first direction D1 may be parallel to the normal direction of a surface of the first substrate 100, and the horizontal direction may be parallel to the surface of the first substrate 100, but not limited thereto. In some embodiments, the memory device 301 may further include a plurality of first word line contact structures 122. Each of the first word line contact structures 122 may be disposed between one of the first vertical transistors T1 and one of the first word line structures 114 in the first direction D1 for electrically connecting the first vertical transistor T1 and the first word line structure 114. In other words, each of the first word line structures 114 may be electrically connected with one of the first vertical transistors T1 via one of the first word line contact structures 122.

In some embodiments, each of the first vertical transistors T1 may be located corresponding to the exposed part of the corresponding first word line structure 114 in the first direction D1 because the area occupied by the first vertical transistor T1 on the second substrate 150 is relatively smaller, and a connection structure between the first word line structure 114 and the first vertical transistor T1 may be simplified accordingly. For example, in some embodiments, each of the first word line contact structures 122 may be a pillar structure elongated in the first direction D1, one end of each of the first word line contact structures 122 in the first direction D1 (such as a bottom end of the first word line contact structure 122) may directly contact the exposed part of the corresponding first word line structure 114, and another end of the first word line contact structures 122 in the first direction D1 (such as a top end of the first word line contact structure 122) may directly contact the corresponding first vertical transistor T1, but not limited thereto. In some embodiments, each of the first vertical transistors T1 may completely cover the corresponding first word line contact structure 122 in the first direction D1, but not limited thereto.

In some embodiments, each of the first vertical transistors T1 may include a first semiconductor channel CH1, a first gate dielectric layer L1, and a first gate electrode G1. The first semiconductor channel CH1 may penetrate the second substrate 150 in the first direction D1, the first gate electrode G1 may be disposed in the second substrate 150 and surround the first semiconductor channel CH1 in a horizontal direction (such as the second direction D2), and the first gate dielectric layer L1 may be disposed in the second substrate 150 and disposed between the first gate electrode G1 and the first semiconductor channel CH1, but not limited thereto. In some embodiments, the first semiconductor channel CH1 may be elongated in the first direction D1, but not limited thereto. In some embodiments, a plurality of first holes H1 may penetrate the second substrate 150 in the first direction D1 respectively, and the first semiconductor channel CH1 and the first gate dielectric layer L1 of the same first vertical transistor T1 may be disposed in one of the first holes H1. Additionally, the second substrate 150 may include a semiconductor substrate, and each of the first gate electrodes G1 may include a first doped region DR1 disposed in the second substrate 150. In some embodiments, the first holes H1 may penetrate the first doped regions DR1 in the first direction D1, and the first doped regions DR1 may be physically connected with one another, but not limited thereto. In other words, the first gate electrodes G1 of the first vertical transistors T1 may be physically and electrically connected with one another in the second substrate 150. However, in some embodiments, the first gate electrodes G1 may be electrically insulated from one another by isolation structures disposed in the second substrate 150. In some embodiments, each of the first vertical transistors T1 may be regarded as a surrounding gate transistor, but not limited thereto. In some embodiments, the first gate electrodes G1 may be formed by implanting suitable dopants into the second substrate 150, and the second substrate 150 may include a semiconductor region (not shown in FIG. 2) without being doped by the dopants used to form the first gate electrodes G1, but not limited thereto. It is worth noting that the first vertical transistors T1 of the present disclosure is not limited to the structure described above and other suitable types of vertical transistors may also be used in the present disclosure.

In some embodiments, the first substrate 100 may have a first side S11 and a second side S12 opposite to the first side S11 in the first direction D1, and the second substrate 150 may have a first side S21 and a second side S22 opposite to the first side S21 in the first direction D1. The first memory array 110 may be disposed on the first substrate 100, and the first memory array and the first word line contact structures 122 may be disposed at the second side S12 of the first substrate 100 and disposed at the first side S21 of the second substrate 150. The first semiconductor channel CH1 of each of the first vertical transistors T1 may penetrate the second substrate 150 in the first direction D1 from the first side S21 of the second substrate 150 to the second side S22 of the second substrate 150, but not limited thereto. In some embodiments, the memory device 301 may further include a plurality of first conductive lines GW1 and a plurality of first connection structures CS1. The first conductive lines GW1 and the first connection structures CS1 may be disposed at the second side S22 of the second substrate 150, and the first connection structures CS1 may be disposed between the first conductive lines GW1 and the second substrate 150 in the first direction D1. Each of the first conductive lines GW1 may be electrically connected with one of the first word line structures 114 via one of the first connection structures CS1, one of the first vertical transistors T1, and one of the first word line contact structures 122.

In some embodiments, the first conductive lines GW1 may be regarded as a global word line routing for the first memory array 110, and the first vertical transistors T1 may be regarded as pass gate transistors (or transmission gate transistors) for controlling signals transmitted from the first conductive lines GW1 to the first word line structures 114, but not limited thereto. In some embodiments, two doped regions (not shown) may be disposed at two opposite ends of the first semiconductor channel CH1 in the first direction D1, the first word line contact structure 122 may contact one of the two doped regions, and the first connection structure CS1 may contact another one of the two doped regions, but not limited thereto. In some embodiments, the first word line contact structure 122 and the first connection structure CS1 may contact the corresponding first semiconductor channel CH1 respectively, and a portion of the first word line contact structure 122 and a portion of the first connection structure CS1 may be regarded as source/drain electrodes of the corresponding first vertical transistor T1, but not limited thereto.

In some embodiments, the memory device 301 may further include a third substrate 200, a second memory array 210, a plurality of second gate contact structures 222, a plurality of second vertical transistors T2, a plurality of second connection structures CS2, and a plurality of second conductive lines GW2. The first memory array 110 may be disposed between the first substrate 100 and the third substrate 200 in the first direction D1, the second substrate 150 is disposed between the first substrate 100 and the third substrate 200 in the first direction D1, the second memory array 210 and the second gate contact structures 222 may be disposed between the third substrate 200 and the second substrate 150 in the first direction D1, and at least a part of each of the second vertical transistors T2 may be disposed in the second substrate 150, but not limited thereto. In some embodiments, the third substrate 200 may have a first side S31 and a second side S32 opposite to the first side S31 in the first direction D1, and the second memory array 210 and the second gate contact structures 222 may be disposed on the third substrate 200 and disposed at the first side S31 of the third substrate 200.

In some embodiments, the second memory array 210 may include a plurality of second word line structures 214, the second vertical transistors T2 may be electrically connected with the second word line structures 214 respectively. In other words, each of the second word line structures 214 may be electrically connected with one of the second vertical transistors T2 in the second substrate 150. In some embodiments, the second memory array 210 may include an alternating conductive/dielectric stack composed of second dielectric layers 212 and the second word line structures 214 alternately stacked in the first direction D1, and the second memory array 210 may have a second staircase portion P2 at an end of the second memory array 210 in a horizontal direction (such as the second direction D2) for exposing a part of each of the second word line structures 214, but not limited thereto. In some embodiments, each of the second word line contact structures 222 may be disposed between one of the second vertical transistors T2 and one of the second word line structures 214 in the first direction D1 for electrically connecting the second vertical transistor T2 and the second word line structure 214. In other words, each of the second word line structures 214 may be electrically connected with one of the second vertical transistors T2 via one of the second word line contact structures 222.

In some embodiments, each of the second vertical transistors T2 may include a second semiconductor channel CH2, a second gate dielectric layer L2, and a second gate electrode G2. In some embodiments, the second semiconductor channel CH2 may penetrate the second substrate 150 in the first direction D1, the second gate electrode G2 may be disposed in the second substrate 150 and surround the second semiconductor channel CH2 in a horizontal direction (such as the second direction D2), and the second gate dielectric layer L2 may be disposed in the second substrate 150 and disposed between the second gate electrode G2 and the second semiconductor channel CH2, but not limited thereto. In some embodiments, the second semiconductor channel CH2 may be elongated in the first direction D1, but not limited thereto. In some embodiments, a plurality of second holes H2 may penetrate the second substrate 150 in the first direction D1 respectively, and the second semiconductor channel CH2 and the second gate dielectric layer L2 of the same second vertical transistor T2 may be disposed in one of the second holes H2. In some embodiments, each of the second gate electrodes G2 may include a second doped region DR2 disposed in the second substrate 150, the second holes H2 may penetrate the second doped regions DR2 in the first direction D1, and the second doped regions DR2 may be physically connected with one another, but not limited thereto. In other words, the second gate electrodes G2 of the second vertical transistors T2 may be physically and electrically connected with one another in the second substrate 150, but not limited thereto. In some embodiments, the second gate electrodes G2 may be electrically insulated from one another by isolation structures disposed in the second substrate 150. In some embodiments, each of the second vertical transistors T2 may be regarded as a surrounding gate transistor, but not limited thereto. It is worth noting that the second vertical transistors T2 of the present disclosure is not limited to the structure described above and other suitable types of vertical transistors may also be used in the present disclosure. For example, a vertical transistor including a semiconductor channel extending in the vertical direction without penetrating the substrate, a gate electrode surrounding the semiconductor channel in the horizontal direction, and a connection structure penetrating a part of the substrate located under or above the semiconductor channel in the vertical direction for contacting the semiconductor channel may also be used as the first vertical transistor and/or the second vertical transistor in the present disclosure.

In some embodiments, the second gate electrodes G2 may be formed by implanting suitable dopants into the second substrate 150, and the composition of the second doped region DR2 may be similar to the composition of the first doped region DR1, but not limited thereto. The structure of the second vertical transistor T2 may be similar to the structure of the first vertical transistor T1 for process simplification, especially when the first vertical transistors T1 and the second vertical transistors T2 are disposed in the same substrate, but not limited thereto. In some embodiments, the structure of the second vertical transistor T2 may be different from the structure of the first vertical transistor T1 no matter where the first vertical transistors T1 and the second vertical transistors T2 are disposed.

In some embodiments, the second conductive lines GW2 and the second connection structures CS2 may be disposed at the first side S21 of the second substrate 150 and disposed between the second substrate 150 and the first substrate 100 in the first direction D1. The second connection structures CS2 may be disposed between the second conductive lines GW2 and the second substrate 150 in the first direction D1. Each of the second conductive lines GW2 may be electrically connected with one of the second word line structures 214 via one of the second connection structures CS2, one of the second vertical transistors T2, and one of the second word line contact structures 222. In some embodiments, the second conductive lines GW2 may be regarded as a global word line routing for the second memory array 210, and the second vertical transistors T2 may be regarded as pass gate transistors (or transmission gate transistors) for controlling signals transmitted from the second conductive lines GW2 to the second word line structures 214, but not limited thereto. In some embodiments, two doped regions (not shown) may be disposed at two opposite ends of the second semiconductor channel CH2 in the first direction D1, the second word line contact structure 222 may contact one of the two doped regions, and the second connection structure CS2 may contact another one of the two doped regions, but not limited thereto. In some embodiments, the second word line contact structure 222 and the second connection structure CS2 may contact the corresponding second semiconductor channel CH2 respectively, and a portion of the second word line contact structure 222 and a portion of the second connection structure CS2 may be regarded as source/drain electrodes of the corresponding second vertical transistor T2, but not limited thereto.

In some embodiments, each of the second vertical transistors T2 may be located corresponding to the exposed part of the corresponding second word line structure 214 in the first direction D1 because the area occupied by the second vertical transistor T2 on the second substrate 150 is relatively smaller, and the second word line contact structure 222 disposed between the second word line structure 214 and the second vertical transistor T2 may be simplified accordingly. For example, in some embodiments, each of the second word line contact structures 222 may be a pillar structure elongated in the first direction D1, one end of each of the second word line contact structures 222 in the first direction D1 may directly contact the exposed part of the corresponding second word line structure 214, and another end of the second word line contact structures 222 in the first direction D1 may directly contact the corresponding second vertical transistor T2, but not limited thereto. In some embodiments, each of the second vertical transistors T2 may completely cover the corresponding second word line contact structure 222 in the first direction D1, but not limited thereto.

In some embodiments, the memory device 301 may further include a first isolation structure 152 disposed in the second substrate 150, and at least a part of the isolation structure 152 may be disposed between the first gate electrode G1 of the first vertical transistor T1 and the second gate electrode G2 of the second vertical transistor T2. In some embodiments, the first gate electrode G1 may be electrically separated from the second gate electrode G2 by the first isolation structure 152, but not limited thereto. In some embodiments, the first gate electrodes G1 and the second gate electrodes G2 may be disposed in the second substrate 150 and physically and electrically connected with one another. In addition, the memory device 301 may further include a first interlayer dielectric 120 and a second interlayer dielectric 220. The first interlayer dielectric 120 may be disposed between the first substrate 100 and the second substrate 150 and cover the first memory array 110, and the second interlayer dielectric 220 may be disposed between the third substrate 200 and the second substrate 150 and cover the second memory array 210. The first word line contact structures 122, the second connection structures CS2, and the second conductive lines GW2 may be disposed in the first interlayer dielectric 120. The second word line contact structures 222, the first connection structures CS1, and the first conductive lines GW1 may be disposed in the second interlayer dielectric 220.

In some embodiments, the first substrate 100, the second substrate 150, and the third substrate 200 may respectively include a semiconductor substrate, such as a silicon substrate, a silicon germanium (SiGe) substrate, a silicon carbide (SiC) substrate, a silicon on insulator (SOI) substrate, a germanium on insulator (GOI) substrate, or other suitable semiconductor substrates or non-semiconductor substrates. In some embodiments, the second substrate 150 may be relatively thinner for forming the first vertical transistors T1 and/or the second vertical transistors T2, but not limited thereto. For example, a thickness TK2 of the second substrate 150 may be less than a thickness TK1 of the first substrate 100 and a thickness TK3 of the third substrate 200. The first dielectric layers 112 and the second dielectric layers 212 may include silicon oxide, silicon nitride, silicon oxynitride or other suitable dielectric materials. The first word line structures 114, the second word line structures 214, the first word line contact structures 122, the second word line contact structures 222, the first connection structures CS1, the second connection structures CS2, the first conductive lines GW1, and the second conductive lines GW2 may respectively include a low resistivity material and a barrier layer surrounding the low resistivity material, but not limited thereto. The low resistivity material mentioned above may include materials having relatively lower resistivity, such as copper, aluminum, cobalt, and tungsten, and the barrier layer mentioned above may include titanium nitride, tantalum nitride, or other suitable barrier materials. The first gate dielectric layers L1 and the second gate dielectric layers L2 may include silicon oxide, silicon oxynitride, a high dielectric constant (high-k) dielectric material, or other suitable dielectric materials. The first semiconductor channels CH1 and the second semiconductor channels CH2 may include amorphous silicon, polysilicon, or other suitable semiconductor materials. The first doped regions DR1 and the second doped regions DR2 may include n-type doped silicon or other suitable doped regions formed in a semiconductor substrate for enhancing electrical conductivity of the first gate electrodes G1 and the second gate electrodes G2. The first interlayer dielectric 120 and the second interlayer dielectric 220 may respectively include a plurality of dielectric layers stacked in the first direction D1, and materials of the dielectric layers may include silicon oxide, silicon nitride, silicon oxynitride, low dielectric constant (low-k) dielectric material, any suitable combination thereof, or other suitable dielectric materials. The first isolation structure 152 may include a single layer or multiple layers of insulation materials, such as silicon oxide, silicon nitride, silicon oxynitride, or other suitable insulation materials.

In some embodiments, a manufacturing method of the memory device 301 may include but is not limited to the following steps. Firstly, the first memory array 110, the first interlayer dielectric 120, the first word line contact structures 122, the second conductive lines GW2, and the second connection structures CS2 may be formed on the first substrate 100; the second memory array 210, the second interlayer dielectric 220, the second word line contact structures 222, the first conductive lines GW1, and the first connection structures CS1 may be formed on the third substrate 200; and the first vertical transistors T1, the second vertical transistors T2, and the first isolation structure 152 may be formed in the second substrate 150. Subsequently, the first substrate 100 with the first memory array 110, the first interlayer dielectric 120, the first word line contact structures 122, the second conductive lines GW2, and the second connection structures CS2 formed thereon, the third substrate 200 with the second memory array 210, the second interlayer dielectric 220, the second word line contact structures 222, the first conductive lines GW1, and the first connection structures CS1 formed thereon, and the second substrate 150 with the first vertical transistors T1 and the second vertical transistors T2 formed therein may be combined with one another by a direct bonding method, such as a metal/dielectric hybrid bonding method, or other suitable bonding approaches. It is worth noting that a thinning process may be performed to the second substrate 150 before the bonding process for reducing the thickness TK2 of the second substrate 150 and exposing the first vertical transistors T1 and the second vertical transistors T2 at the first side S21 and the second side S22 of the second substrate 150, but not limited thereto. In some embodiments, other thinning processes may be performed to the first substrate 100 and/or the third substrate 200 before or after the bonding process described above for reducing the total thickness of the memory device 301. In the present disclosure, two or more than two memory arrays disposed on different substrates maybe integrated by the method described above for increasing the total storage capacity of the memory device and simplifying the related routing design.

In some embodiments, the memory array described above may include a 3D NAND memory array, a 3D NOR memory array, a dynamic random access memory (DRAM) array, a 3D XPoint memory array, or other suitable 3D memory structures. In some embodiments, memory strings (not shown) may penetrate the alternating conductive/dielectric stack of the memory array in the first direction D1. Each of the memory strings may have a cylinder shape (e.g., a pillar shape) elongated in the first direction D1, and each of the memory strings may include a channel layer, a tunneling layer, a storage layer, and a blocking layer arranged radially from the center toward the outer surface of the pillar in this order, but not limited thereto. The memory arrays in the present disclosure are not limited to the structure shown in FIG. 2 and/or the structure described above, and other suitable memory array architectures may also be applied in the present disclosure.

Figure 3:
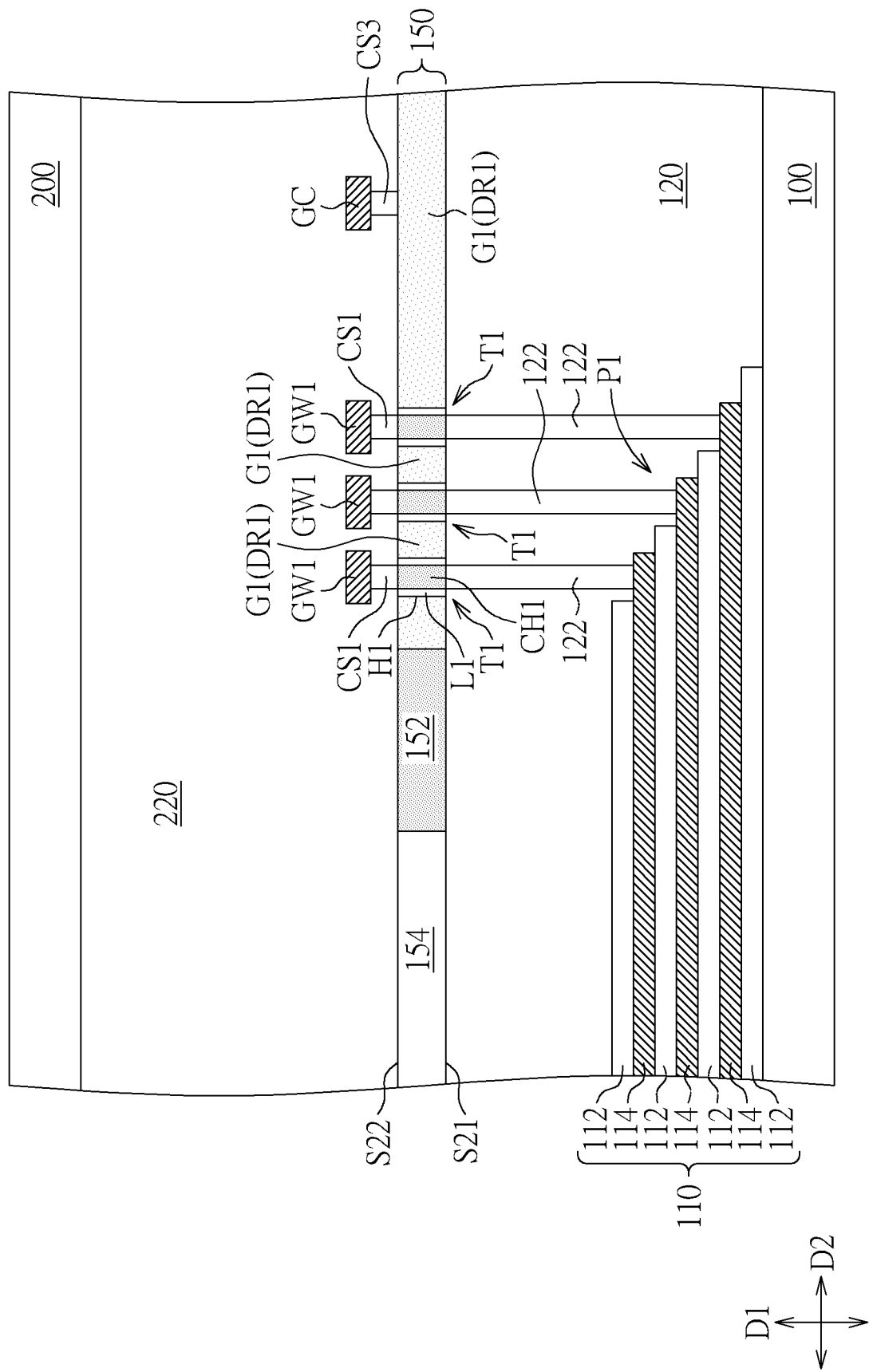
FIG. 3 is a schematic drawing illustrating a memory device according to an embodiment of the present disclosure.
Figure 4:
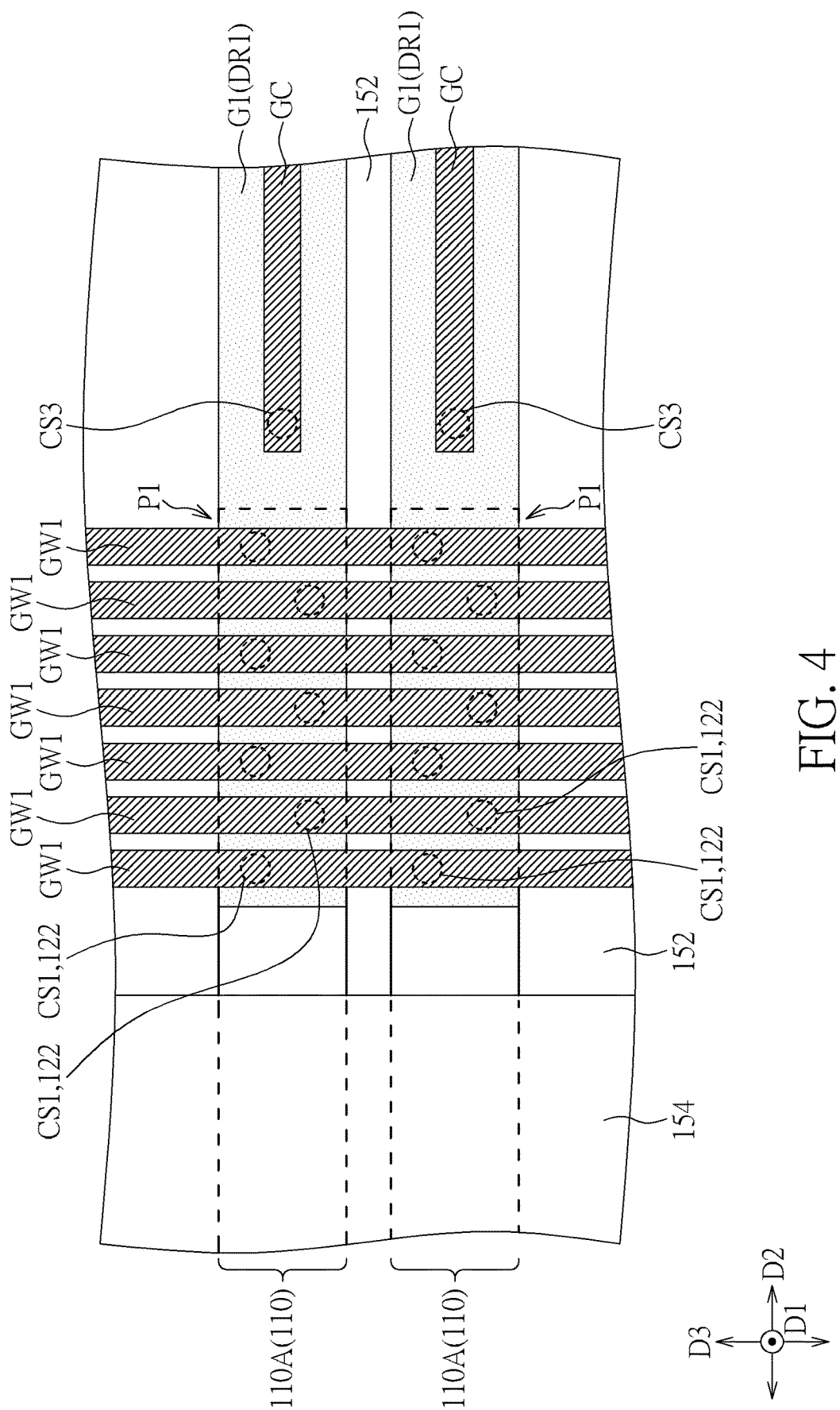
FIG. 4 is a schematic drawing illustrating a top view of a portion of a memory device according to an embodiment of the present disclosure.

Please refer to FIGS. 2-4. FIG. 3 is a schematic drawing illustrating a memory device according to an embodiment of the present disclosure, and FIG. 4 is a schematic drawing illustrating a top view of a portion of a memory device according to an embodiment of the present disclosure. FIG. 3 may be regarded as a schematic drawing illustrating another portion of the memory device 301 in the first embodiment described above, and FIG. 4 may be regarded as a schematic drawing illustrating a top view of a portion of a memory device similar to the memory device 301 in the first embodiment described above, but not limited thereto. As shown in FIG. 2 and FIG. 3, in some embodiments, the memory device 301 may further include a third connection structure CS3 and a third conductive line GC disposed at the second side S22 of the second substrate 150 and disposed in the second interlayer dielectric 220. The third conductive line GC may be electrically connected with the first gate electrodes G1 of the first vertical transistors T1 via the third connection structure CS3 for transmitting signals to the first gate electrodes G1 and controlling the switching condition of the first vertical transistors T1. In some embodiments, the third connection structure CS3 and the first connection structures CS1 may be formed with the same composition and/or be formed by the same process, and the third conductive line GC and the first conductive lines GW1 may be formed with the same composition and/or be formed by the same process, but not limited thereto. Additionally, in some embodiments, the second substrate 150 may include a semiconductor region 154, and at least a part of the first isolation structure 152 may be disposed between the semiconductor region 154 and the first gate electrode G1. Other circuit structures (not shown) may be formed on and/or formed in the semiconductor region 154, but not limited thereto.

As shown in FIGS. 2-4, in some embodiments, the first memory array 110 may be divided into memory blocks 110A by a slit structure (not shown), and each of the first conductive lines GW1 may be elongated in another horizontal direction (such as a third direction D3 shown in FIG. 4) and overlap the first staircase portions P1 of different memory blocks 110A in the first direction D1. In addition, the first gate electrodes G1 corresponding to different memory blocks 110A may be separated from one another by the first isolation structure 152, and the third conductive line GC may be elongated in the second direction D2 substantially orthogonal to the third direction D3, but not limited thereto. In some embodiments, the semiconductor region 154 may be separated from the first gate electrodes G1 by the first isolation structure 152, and the semiconductor region 154 may not overlap the first staircase portions P1 in the first direction D1 accordingly, but not limited thereto. It is worth noting that components similar to the third conductive line GC and the third connection structure CS3 described above may be applied to the second memory array 210 in the present disclosure, and the features shown in FIG. 3 and FIG. 4 may also be applied in other embodiments of the present disclosure.

The following description will detail the different embodiments of the present disclosure. To simplify the description, identical components in each of the following embodiments are marked with identical symbols. For making it easier to understand the differences between the embodiments, the following description will detail the dissimilarities among different embodiments and the identical features will not be redundantly described.

Figure 5:
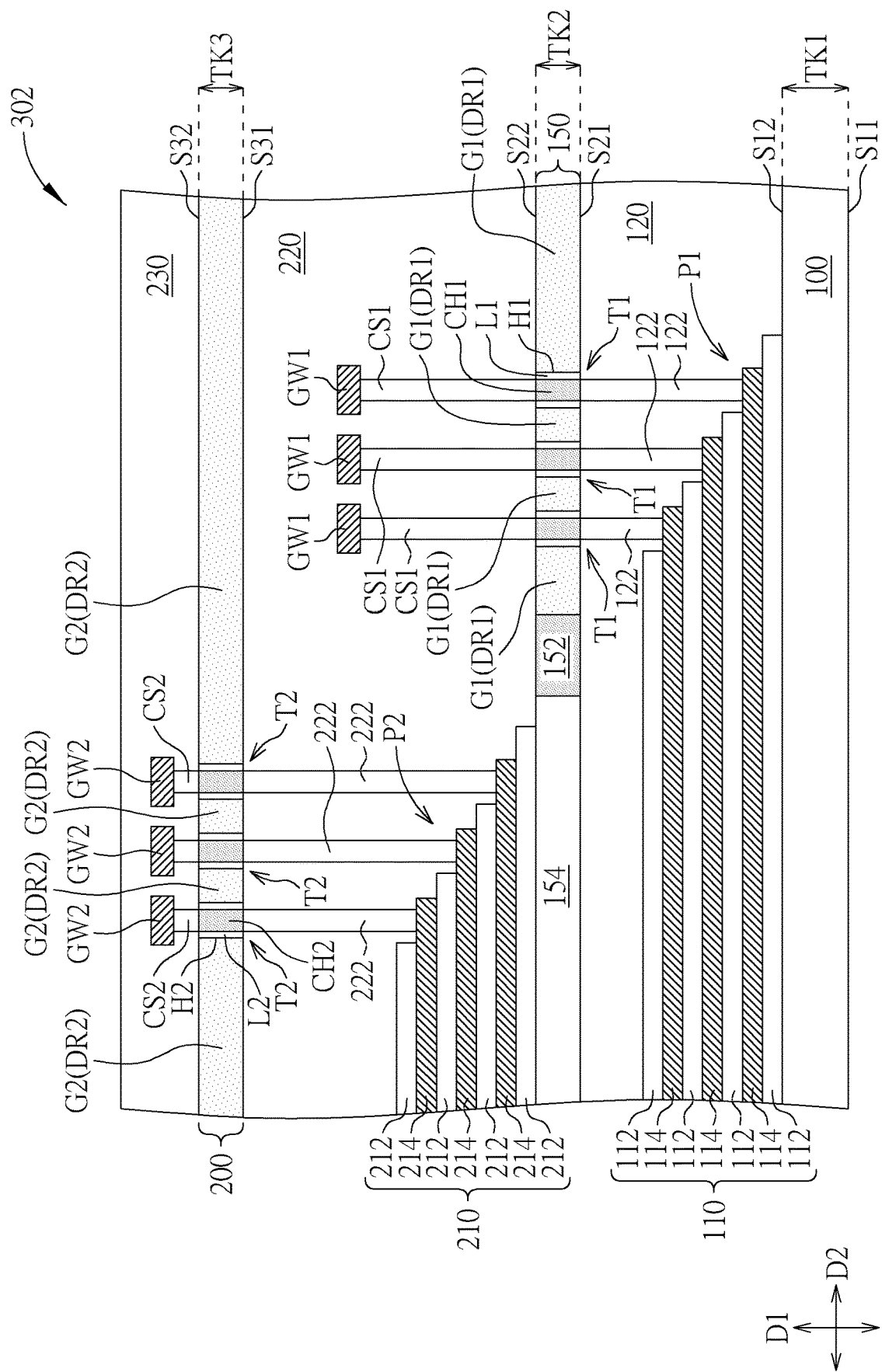
FIG. 5 is a schematic drawing illustrating a memory device according to a second embodiment of the present disclosure.

Please refer to FIG. 5. FIG. 5 is a schematic drawing illustrating a memory device 302 according to a second embodiment of the present disclosure. As shown in FIG. 5, in the memory device 302, the second memory array 210 may be disposed on the second substrate 150, a part of the second interlay dielectric 220 may be disposed between the second memory array 210 and the third substrate 200 in the first direction D1, and at least a part of each of the second vertical transistors T2 may be disposed in the third substrate 200. In some embodiments, the second semiconductor channel CH2 may penetrate the third substrate 200 in the first direction D1, the second gate electrode G2 may be disposed in the third substrate 200 and surround the second semiconductor channel CH2 in the horizontal direction, and the second gate dielectric layer L2 may be disposed in the third substrate 200 and disposed between the second gate electrode G2 and the second semiconductor channel CH2, but not limited thereto. In some embodiments, each of the second gate electrodes G2 may include a second doped region DR2 disposed in the third substrate 200, and the second holes H2 may penetrate the second doped regions DR2 in the first direction D1, but not limited thereto. In some embodiments, the second gate electrodes G2 of the second vertical transistors T2 may be physically and electrically connected with one another in the third substrate 150, and the second gate electrodes G2 of the second vertical transistors T2 may be separated from the first gate electrodes G1 of the first vertical transistors T1. Additionally, the second connection structures CS2 and the second conductive lines GW2 may be disposed at the second side S32 of the third substrate 200 and a protection layer 230 may be disposed on the third substrate 200 and cover the second connection structures CS2 and the second conductive lines GW2. The protection layer 230 may include silicon oxide, silicon nitride, or other suitable insulation materials. In some embodiments, the second memory array 210 may be disposed on the semiconductor region 154, and a part of the first memory array 110 may overlap the second memory array 210 in the first direction D1, but not limited thereto.

A manufacturing method of the memory device 302 may include but is not limited to the following steps. Firstly, the first memory array 110, the first interlayer dielectric 120, and the first word line contact structures 122 may be formed on the first substrate 100; the first vertical transistors T1 and the first isolation structure 152 may be formed in the second substrate 150; the second memory array 210, the second interlayer dielectric 220, the second word line contact structures 222, the first conductive lines GW1, and the first connection structures CS1 may be formed on the third substrate 200; the second vertical transistors T2 may be formed in the third substrate 200; and the second conductive lines GW2, the second connection structures CS2; and the protection layer 230 may be formed on the third substrate 200. Subsequently, the first substrate 100 with the first memory array 110, the first interlayer dielectric 120, and the first word line contact structures 122 formed thereon, the second substrate 150 with the first vertical transistors T1 formed therein and the second memory array 210, the second interlayer dielectric 220, the second word line contact structures 222, the first conductive lines GW1, and the first connection structures CS1 formed thereon, and the third substrate 200 with the second vertical transistors T2 formed therein and the second conductive lines GW2, the second connection structures CS2, and the protection layer 230 formed thereon may be combined with one another by a direct bonding method, such as a metal/dielectric hybrid bonding method, or other suitable bonding approaches. It is worth noting that thinning processes may be performed to the second substrate 150 and/or the third substrate 200 before the bonding process for reducing the thickness TK2 of the second substrate 150 and the thickness TK3 of the third substrate 200, exposing the first vertical transistors T1 at the first side S21 and the second side S22 of the second substrate 150, and exposing the second vertical transistors T2 at the first side S31 and the second side S32 of the third substrate 200, but not limited thereto. Accordingly, the thickness TK2 of the second substrate 150 and the thickness TK3 of the third substrate 200 may be less than the thickness of the first substrate 100, but not limited thereto.

Figure 6:
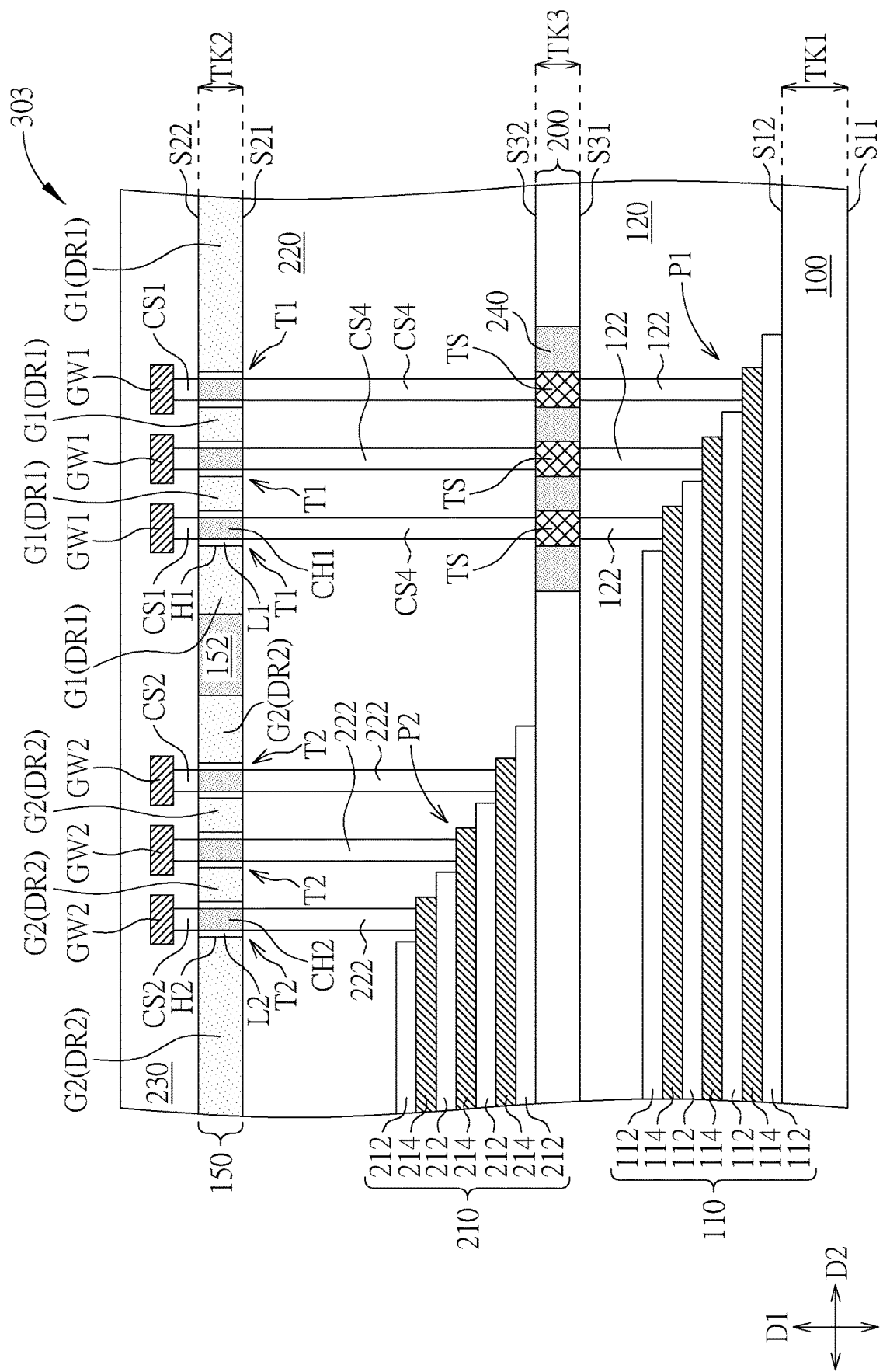
FIG. 6 is a schematic drawing illustrating a memory device according to a third embodiment of the present disclosure.

Please refer to FIG. 6. FIG. 6 is a schematic drawing illustrating a memory device 303 according to a third embodiment of the present disclosure. As shown in FIG. 6, in the memory device 303, the third substrate 200 may be disposed between the first substrate 100 and the second substrate 150 in the first direction D1, and the second memory array 210 may be disposed between the second substrate 150 and the third substrate 200 in the first direction D1. In some embodiments, the second memory array 210 may be disposed on the third substrate 200 and disposed at the second side S32 of the third substrate 200 and the first side S21 of the second substrate 150, and the first conductive lines GW1, the second conductive lines GW2, the first connection structures CS1, the second connection structures CS2, and the protection layer 230 may be disposed on the second substrate 150 and disposed at the second side S22 of the second substrate 150. In some embodiments, the memory device 303 may further include a plurality of fourth connection structures CS4, a plurality of through substrate connection structures TS, and a second isolation structure 240. The second isolation structure 240 may be disposed in the third substrate 200, each of the through substrate connection structures TS may be disposed in the third substrate 200 and penetrating the second isolation structure 240 in the first direction D1, and each of the fourth connection structures CS4 may be disposed in the second interlayer dielectric 220 and disposed between one of the second vertical transistors T2 and one of the through substrate connection structures TS in the first direction D1. Each of the through substrate connection structures TS may be electrically connected with one of the first word line contact structures 122 and one of the fourth connection structures CS4, and each of the fourth connection structures CS4 may be electrically connected with one of the first vertical transistors T1. Therefore, each of the first conductive lines GW1 may be electrically connected with one of the first word line structures 114 via one of the first connection structures CS1, one of the first vertical transistors T1, one of the fourth connection structures CS4, one of the through substrate connection structures TS, and one of the first word line contact structures 122. The second isolation structure 240 may include a single layer or multiple layers of insulation materials, such as silicon oxide, silicon nitride, silicon oxynitride, or other suitable insulation materials. The fourth connection structures CS4 and the through substrate connection structures TS may include a low resistivity material and a barrier layer surrounding the low resistivity material, but not limited thereto. The low resistivity material mentioned above may include materials having relatively lower resistivity, such as copper, aluminum, cobalt, and tungsten, and the barrier layer mentioned above may include titanium nitride, tantalum nitride, or other suitable barrier materials.

A manufacturing method of the memory device 303 may include but is not limited to the following steps. Firstly, the first memory array 110, the first interlayer dielectric 120, and the first word line contact structures 122 may be formed on the first substrate 100; the through substrate connection structures TS and the second isolation structure 240 may be formed in the third substrate 200; the second memory array 210, the second interlayer dielectric 220, the second word line contact structures 222, and the fourth connection structures CS4 may be formed on the third substrate 200; the first vertical transistors T1, the second vertical transistors T2, and the first isolation structure 152 may be formed in the second substrate 150; and the first connection structures CS1, the second connection structures CS2, the first conductive lines GW1, the second conductive lines GW2, and the protection layer 230 may be formed on the second substrate 150. Subsequently, the first substrate 100 with the first memory array 110, the first interlayer dielectric 120, and the first word line contact structures 122 formed thereon, the third substrate 200 with the through substrate connection structures TS and the second isolation structure 240 formed therein and the second memory array 210, the second interlayer dielectric 220, the second word line contact structures 222, and the fourth connection structures CS4 formed thereon, and the second substrate 150 with the first vertical transistors T1, the second vertical transistors T2, and the first isolation structure 152 formed therein and the first connection structures CS1, the second connection structures CS2, the first conductive lines GW1, the second conductive lines GW2, and the protection layer 230 formed thereon may be combined with one another by a direct bonding method, such as a metal/dielectric hybrid bonding method, or other suitable bonding approaches. It is worth noting that a thinning process may be performed to the second substrate 150 before the bonding process for reducing the thickness TK2 of the second substrate 150 and exposing the first vertical transistors T1 and the second vertical transistors T2 at the first side S21 and the second side S22 of the second substrate 150, but not limited thereto.

Figure 7:
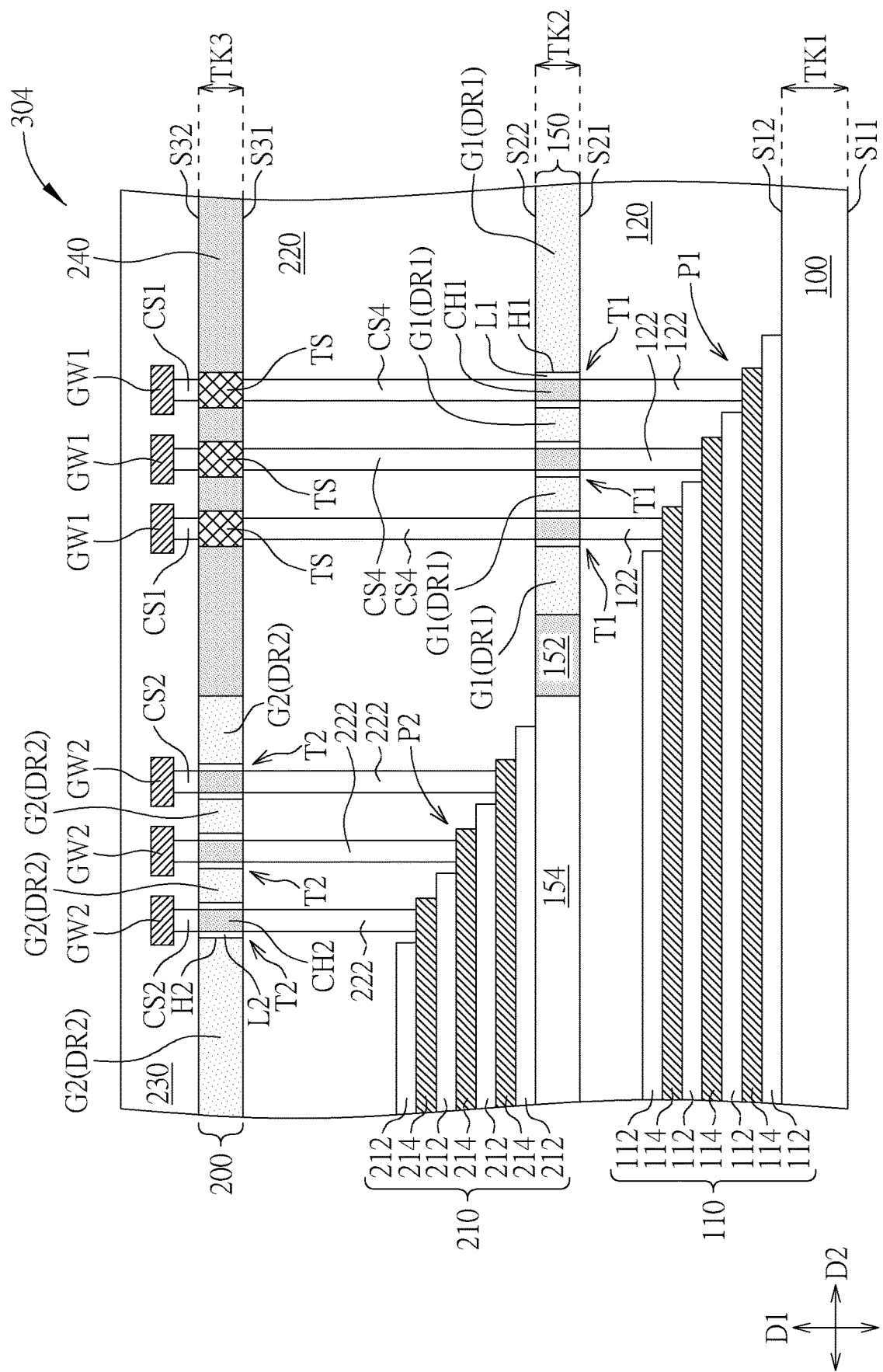
FIG. 7 is a schematic drawing illustrating a memory device according to a fourth embodiment of the present disclosure.

Please refer to FIG. 7. FIG. 7 is a schematic drawing illustrating a memory device 304 according to a fourth embodiment of the present disclosure. As shown in FIG. 7, in the memory device 304, the first conductive lines GW1, the second conductive lines GW2, the first connection structures CS1, the second connection structures CS2, and the protection layer 230 may be disposed on the third substrate 200 and disposed at the second side S32 of the third substrate 200. In addition, the second isolation structure 240 and the through substrate connection structures TS may be disposed in the third substrate 200, and each of the first vertical transistors T1 in the second substrate 150 may be electrically connected with one of the first conductive lines GW1 via one the fourth connection structures CS4, one of the through substrate connection structures TS, and one of the first connection structures CS1.

Figure 8:
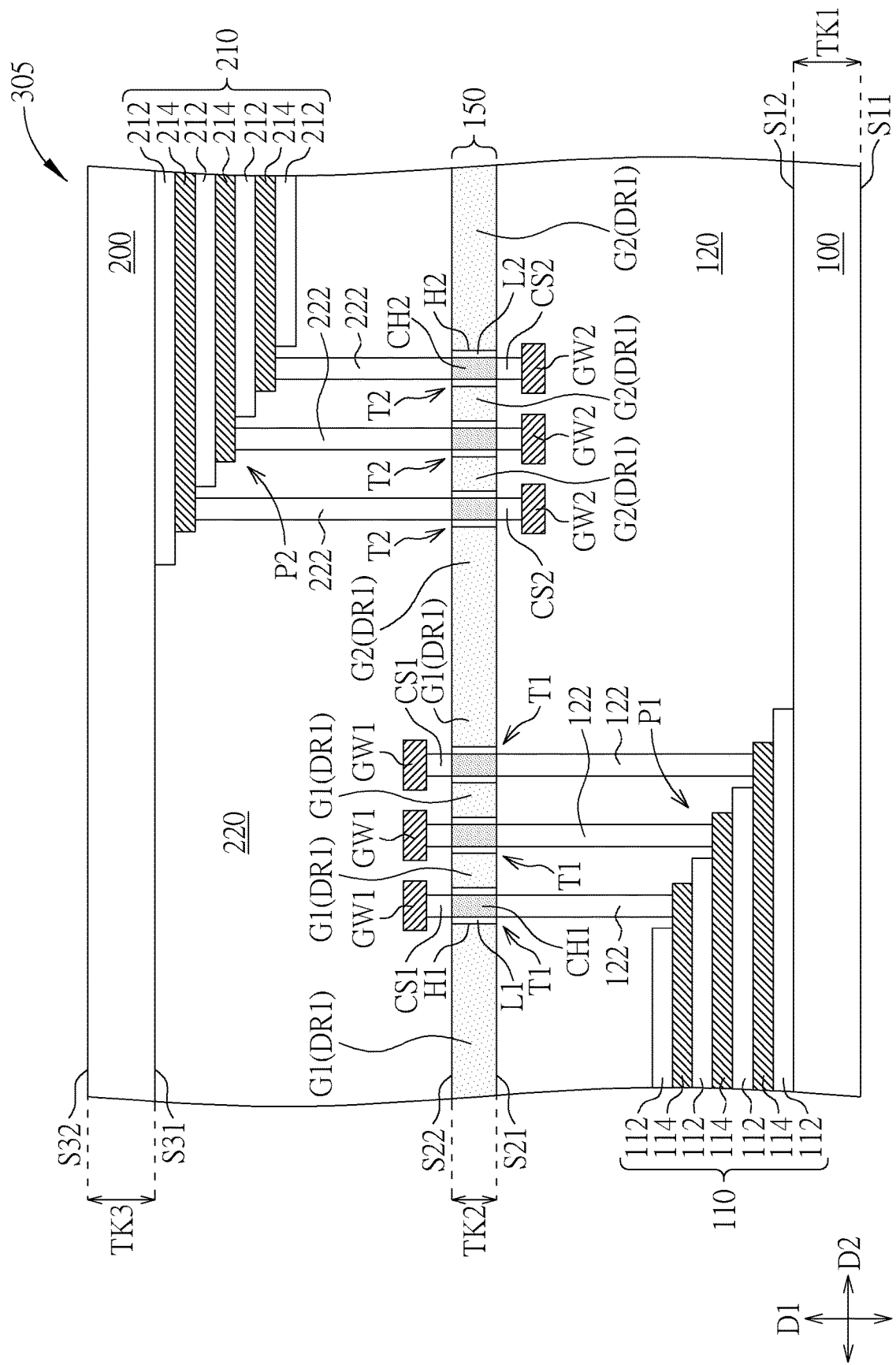
FIG. 8 is a schematic drawing illustrating a memory device according to a fifth embodiment of the present disclosure.

Please refer to FIG. 8. FIG. 8 is a schematic drawing illustrating a memory device 305 according to a fifth embodiment of the present disclosure. As shown in FIG. 8, in the memory device 305, the first gate electrodes G1 of the first vertical transistors T1 may be physically and electrically connected with the second gate electrodes G2 of the second vertical transistors T2. In some embodiments, the first gate electrodes G1 and the second gate electrodes G2 may be formed with the same doped region (such as the first doped region DR1) in the second substrate 150, but not limited thereto.

Figure 9:
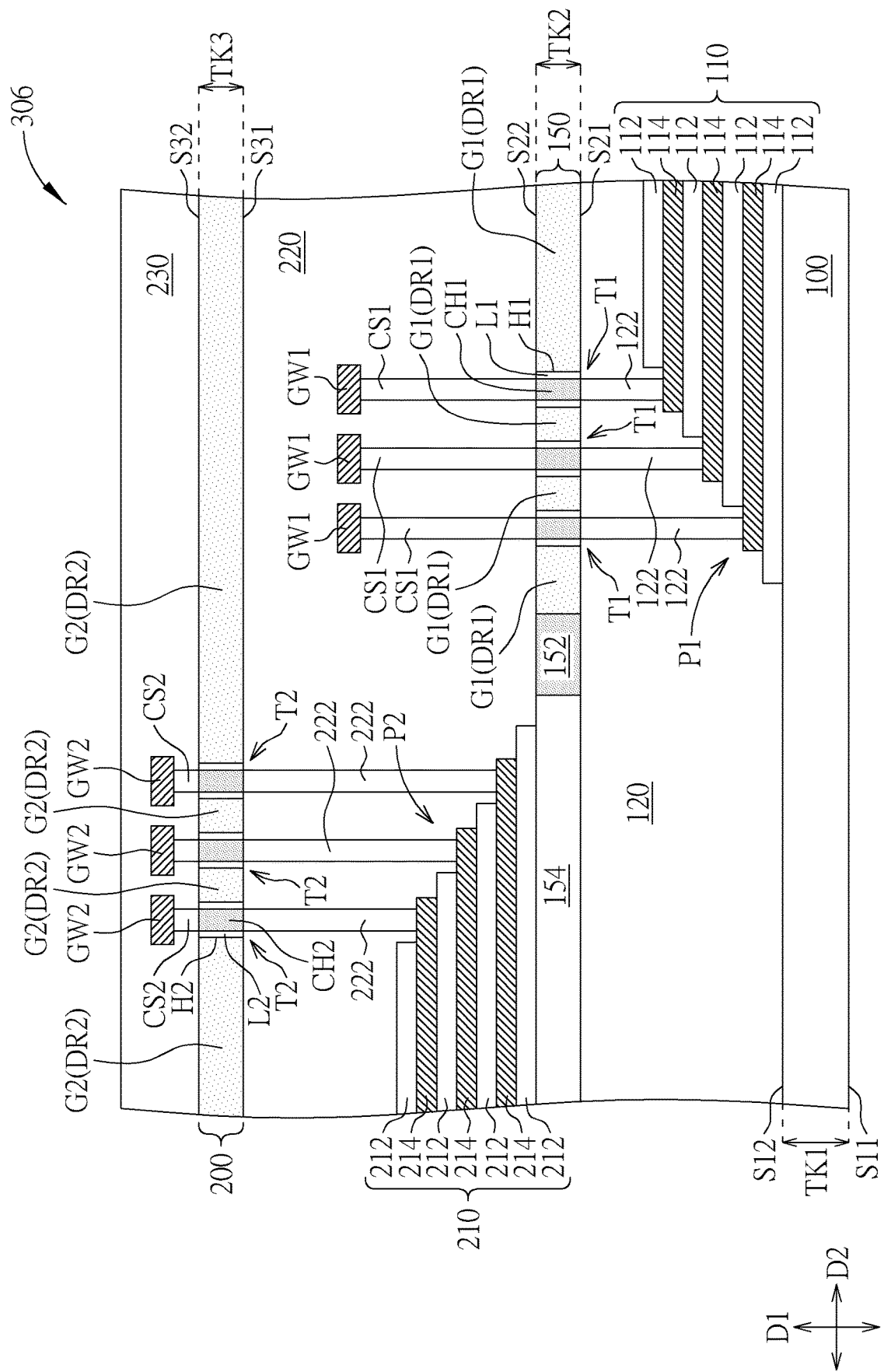
FIG. 9 is a schematic drawing illustrating a memory device according to a sixth embodiment of the present disclosure.

Please refer to FIG. 9. FIG. 9 is a schematic drawing illustrating a memory device 306 according to a sixth embodiment of the present disclosure. As shown in FIG. 9 and FIG. 5 described above, the difference between the memory device 306 in this embodiment and the memory device 302 described above is that, in the memory device 306, the second memory array 210 may not overlap the first memory array 110 in the first direction D1, and in a top view of the memory device 306, the second staircase portion P2 of the second memory array 210 may be disposed adjacent to the first staircase portion P1 in the second direction D2, but not limited thereto. In a top view of the memory device 306, the shape of the second memory array 210 may be the same as a mirror image of the shape of the first memory array 110, and the shape of the first memory array 110 and the shape of the second memory array 210 may be a mirror symmetry patterns in some embodiments, but not limited thereto. It is worth noting that the relative allocation of the first memory array 110 and the second memory array 210 may also be applied in other embodiments of the present disclosure.

Figure 10:
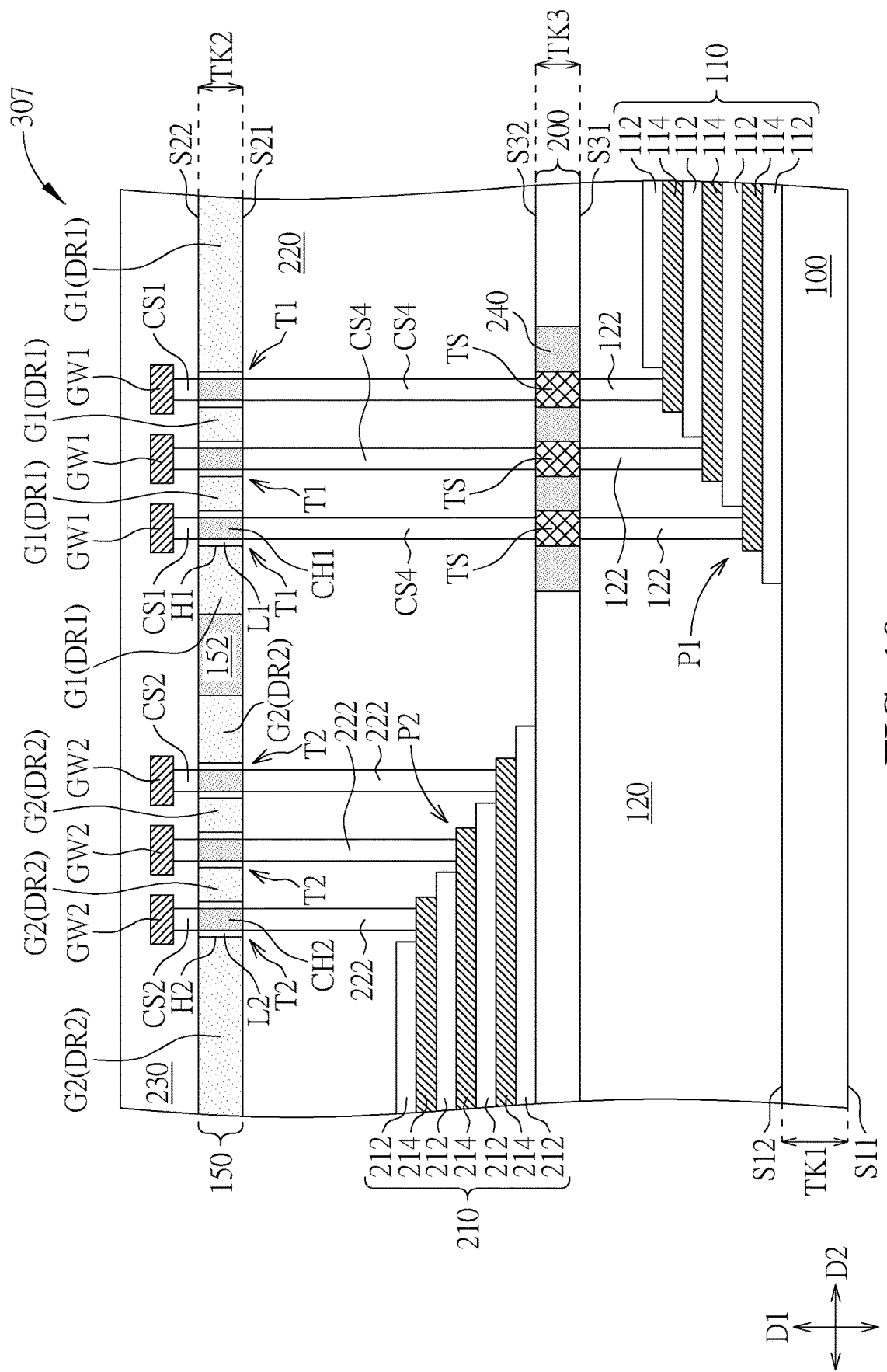
FIG. 10 is a schematic drawing illustrating a memory device according to a seventh embodiment of the present disclosure.

Please refer to FIG. 10. FIG. 10 is a schematic drawing illustrating a memory device 307 according to a seventh embodiment of the present disclosure. As shown in FIG. 9 and FIG. 6 described above, the difference between the memory device 307 in this embodiment and the memory device 303 described above is that, in the memory device 307, the second memory array 210 may not overlap the first memory array 110 in the first direction D1, and in a top view of the memory device 307, the second staircase portion P2 of the second memory array 210 may be disposed adjacent to the first staircase portion P1 in the second direction D2, but not limited thereto. In a top view of the memory device 307, the shape of the second memory array 210 may be the same as a mirror image of the shape of the first memory array 110, and the shape of the first memory array 110 and the shape of the second memory array 210 may be a mirror symmetry patterns in some embodiments, but not limited thereto.

To summarize the above descriptions, in the memory device according to the present disclosure, the vertical transistors disposed in the substrate are electrically connected to the word line structures of the memory array disposed on another substrate respectively. The area occupied by the vertical transistors on the substrate may be reduced, and the word line contact structures located between the vertical transistors and the word line structures may be simplified accordingly.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A memory device, comprising:
   a first substrate;
   a first memory array disposed on the first substrate, wherein the first memory array comprises at least one first word line structure;
   a second substrate, wherein the first memory array is disposed between the first substrate and the second substrate in a vertical direction; and
   at least one first vertical transistor electrically connected with the at least one first word line structure, wherein at least a part of the at least one first vertical transistor is disposed in the second substrate, and the at least one first vertical transistor comprises:
   a first semiconductor channel penetrating the second substrate in the vertical direction; and
   a first gate electrode disposed in the second substrate and surrounding the first semiconductor channel in a horizontal direction.

2. The memory device according to claim 1, wherein the at least one first vertical transistor further comprises:
   a first gate dielectric layer disposed in the second substrate and disposed between the first gate electrode and the first semiconductor channel.

3. The memory device according to claim 1, wherein the first memory array comprises a plurality of the at least one first word line structures, and the memory device comprises a plurality of the at least one first vertical transistors electrically connected with the plurality of the at least one first word line structures respectively.

4. The memory device according to claim 3, wherein the first gate electrodes of the plurality of the at least one first vertical transistors are physically and electrically connected with one another in the second substrate.

5. The memory device according to claim 1, wherein the second substrate comprises a semiconductor region, and the first gate electrode comprises a doped region disposed in the second substrate.

6. The memory device according to claim 5, further comprising an isolation structure disposed in the second substrate, wherein the isolation structure is disposed between the semiconductor region and the first gate electrode.

7. The memory device according to claim 1, further comprising:
   a word line contact structure disposed between the at least one first vertical transistor and the at least one first word line structure, and the at least one first word line structure is electrically connected with the at least one first vertical transistor via the word line contact structure.

8. The memory device according to claim 7, wherein the at least one first vertical transistor completely covers the word line contact structure in the vertical direction.

9. The memory device according to claim 7, wherein the second substrate has a first side and a second side opposite to the first side in the vertical direction, and the first memory array and the word line contact structure are disposed at the first side of the second substrate.

10. The memory device according to claim 9, further comprising:
    a conductive line disposed at the second side of the second substrate; and
    a connection structure disposed at the second side of the second substrate and disposed between the conductive line and the at least one first vertical transistor, wherein the conductive line is electrically connected with the at least one first word line structure via the connection structure, the at least one first vertical transistor, and the word line contact structure.

11. The memory device according to claim 1, further comprising:
    a third substrate, wherein the first memory array is disposed between the first substrate and the third substrate in the vertical direction;
    a second memory array, wherein the second memory array comprises at least one second word line structure; and
    at least one second vertical transistor electrically connected with the at least one second word line structure.

12. The memory device according to claim 11, wherein the second memory array is disposed on the third substrate, and at least a part of the at least one second vertical transistor is disposed in the second substrate.

13. The memory device according to claim 12, wherein the at least one second vertical transistor comprises:
    a second semiconductor channel penetrating the second substrate in the vertical direction; and
    a second gate electrode disposed in the second substrate and surrounding the second semiconductor channel in the horizontal direction.

14. The memory device according to claim 13, wherein the first gate electrode is physically and electrically connected with the second gate electrode.

15. The memory device according to claim 13, wherein the first gate electrode is electrically separated from the second gate electrode.

16. The memory device according to claim 12, wherein the third substrate is disposed between the first substrate and the second substrate in the vertical direction, and the second memory array is disposed between the second substrate and the third substrate in the vertical direction.

17. The memory device according to claim 11, wherein the second substrate is disposed between the first substrate and the third substrate in the vertical direction, and the second memory array is disposed between the second substrate and the third substrate in the vertical direction.

18. The memory device according to claim 17, wherein the second memory array is disposed on the second substrate, and at least a part of the at least one second vertical transistor is disposed in the third substrate.

* * * * *